United States Patent
Ryan et al.

[19]

[11] Patent Number: 5,972,727

[45] Date of Patent: Oct. 26, 1999

[54] RETICLE SORTER

[75] Inventors: Patrick J. Ryan; Michael R. Conboy; Stephen P. Hovestol, all of Austin, Tex.

[73] Assignee: Advanced Micro Devices, Austin, Tex.

[21] Appl. No.: 09/107,111

[22] Filed: Jun. 30, 1998

[51] Int. Cl.[6] .............................. H01L 21/66; G01R 31/26
[52] U.S. Cl. .............................. 438/14; 438/15; 29/25.01; 250/548; 355/97
[58] Field of Search ...................... 438/14, 15; 29/25.01; 250/548; 355/97

[56] References Cited

U.S. PATENT DOCUMENTS

| | | | |
|---|---|---|---|
| 4,477,926 | 10/1984 | Linger et al. | 382/149 |
| 4,999,671 | 3/1991 | Iizuka | 355/97 |
| 5,727,685 | 3/1998 | Laganza et al. | |

*Primary Examiner*—John F. Niebling
*Assistant Examiner*—John Murphy
*Attorney, Agent, or Firm*—Merchant & Gould P.C.

[57] ABSTRACT

A reticle sorter and a semiconductor fabrication facility employing one or more reticle sorters is provided. The reticle sorter(s) generally lies between a reticle storage system and a group of one or more photolithography exposure tools (e.g., steppers) and is configured for sorting reticles in one or more cassettes. The use of the reticle sorter provides sorting functionality apart from the reticle storage system and typically closer to the group of photolithography steppers with which it is associated. This can, for example, significantly increase the throughput of semiconductor wafers through the associated photolithography exposure tools as well as in the semiconductor fabrication plant as a whole.

20 Claims, 4 Drawing Sheets

RETICLE SORTER

FIELD OF THE INVENTION

The present invention generally relates to the semiconductor fabrication process and, more particularly, to a reticle sorter and a semiconductor fabrication facility employing one or more reticle sorters.

BACKGROUND OF THE INVENTION

Semiconductor manufacturers compete in a highly competitive and capital-intensive industry. A state-of-the-art semiconductor fabrication facility can cost $1 billion or more and include hundreds of different fabrication tools including, for example, material stockers, chemical vapor deposition (CVD) systems, photolithography systems, chemical-mechanical planarization systems, etc. On any given day, a number of different batches of semiconductor wafers can run through a fabrication facility. To recover the capitalization costs and remain competitive, semiconductor manufacturers continually seek to improve semiconductor throughput and yield.

Manufacturers pay particular attention to the photolithography process, a process which occupies a substantial amount of floor space and is performed on a given wafer a number of different times throughout the fabrication process. The photolithography process typically involves applying a photoresist layer (e.g., $SiO_2$) over the surface of a semiconductor wafer using a coating machine or coater. The wafer then moves to an exposure tool, such as a photolithography stepper, which exposes the photoresist layer to a patterned light source. The light source is typically patterned using a mask or reticle (hereinafter reticle). The reticle typically contains clear and opaque features which generally define the pattern to be created in the photoresist layer. The exposed photoresist is then developed and regions of the photoresist are dissolved such that the pattern is transferred to the photoresist layer. The exposed regions of the underlying semiconductor wafer layer are then processed by, for example, etching the exposed wafer layer, depositing a material on the exposed wafer layer, or doping the exposed wafer layer.

For a given wafer, the photolithography process may be used a number of times as layers are formed over layers to form the ultimate semiconductor device structure. To perform the various photolithography processes, a typical plant employs upwards of 10–20 different photolithography steppers and can use thousands of different reticles. Given the substantial use of photolithography in the semiconductor fabrication process, manufacturers find any increase in the throughput of photolithography systems to be highly desirable.

SUMMARY OF THE INVENTION

The present invention provides a reticle sorter and a semiconductor fabrication facility employing one or more reticle sorters. The reticle sorter(s) generally lies between a reticle storage system and a group or cell of one or more photolithography exposure tools and is configured for sorting reticles in one or more cassettes. The use of the reticle sorter provides sorting functionality apart from the reticle storage system and typically closer to the cell of photolithography exposure tool(s) with which it is associated. This can, for example, significantly increase the throughput of semiconductor wafers through the associated exposure tools as well as in the semiconductor fabrication plant as a whole.

In accordance with one embodiment of the invention, there is provided a reticle sorter coupled between a reticle storage system and one or more photolithography exposure tools. The reticle sorter includes one or more bays each capable of holding a cassette having slots for reticles and a sorting system capable of retrieving the reticles from and inserting the reticles into the slots in order to sort the reticles within the cassettes. The reticle sorter may further include an inspection system, coupled between the one or more bays and an input port, for inspecting a characteristic of each reticle. The inspection system may, for example, provide a visual display of each reticle as it is loaded into the reticle sorter, inspect each reticle for dust and/or inspect for flaws in the reticle pattern.

The above summary of the present invention is not intended to describe each illustrated embodiment or every implementation of the present invention. The FIGS. and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 3A–3C illustrate components of an exemplary reticle sorter in accordance with another embodiment of the invention.

Figure 1:
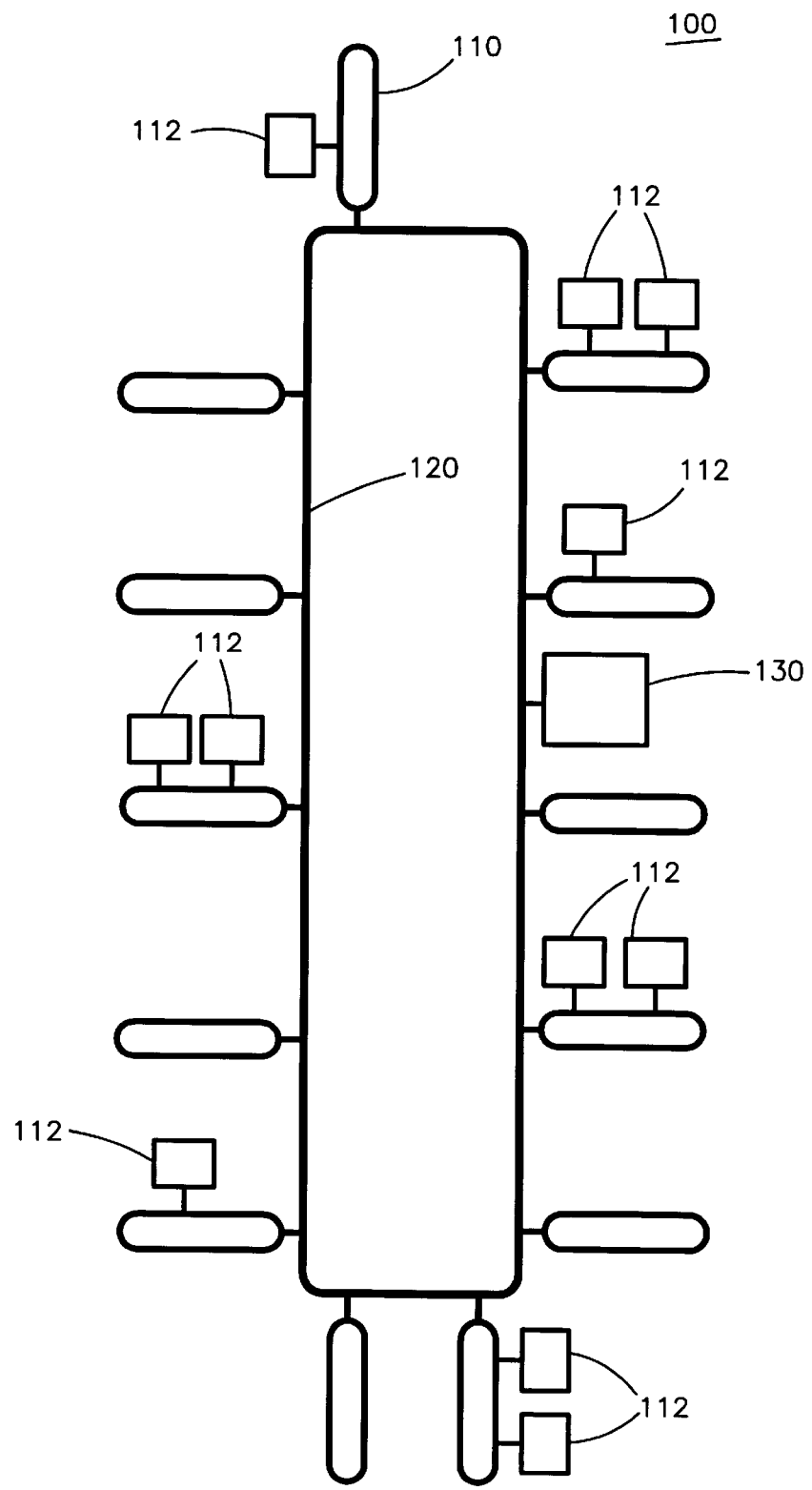
FIG. 1 schematically illustrates a conventional semiconductor fabrication facility.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

FIG. 1 schematically illustrates, albeit in a relatively simple form, a conventional semiconductor fabrication facility 100. The fabrication plant 100 typically includes multiple fabrication areas or bays 110 interconnected by a path 120, such as a conveyor belt. Each bay 110 generally includes the requisite processing tools to process semiconductor wafers for a particular purpose, such as photolithography, chemical-mechanical polishing, or chemical vapor deposition, for example. To handle the various photolithography processes, the conventional plant 100 further includes multiple photolithography exposure tools such as steppers 112 and a single reticle storage system 130. The photolithography steppers 112 generally use a number of different reticles for fabricating layers of semiconductor wafers. The reticle storage system 130 generally handles storage and sorting of reticles within cassettes. The reticle storage system 130 typically includes a buffer or queue for storing reticles, one or more inspecting systems for inspecting various characteristics of the reticles, and a sorting system for rearranging the various reticles within various cassettes as dictated by the fabrication process. In many fabrication facilities, the buffer of the reticle storage system 130 may have enough room to store up to 1500 reticles or 300 cassettes. The inspection systems may include systems for detecting dust particles in the reticle, identifying flaws in the reticle pattern, the visual inspection system and so forth as well known in the art. While not shown, the semiconductor fabrication plant 100, including the bays 110, photolithography steppers 112, reticle storage system 130 and the interconnecting path 120, typically operates under control of a host system, typically a distribution computer system operating under a factory management program, such as WorkStream Open™ sold by Consilium, Inc.

Figure 2:
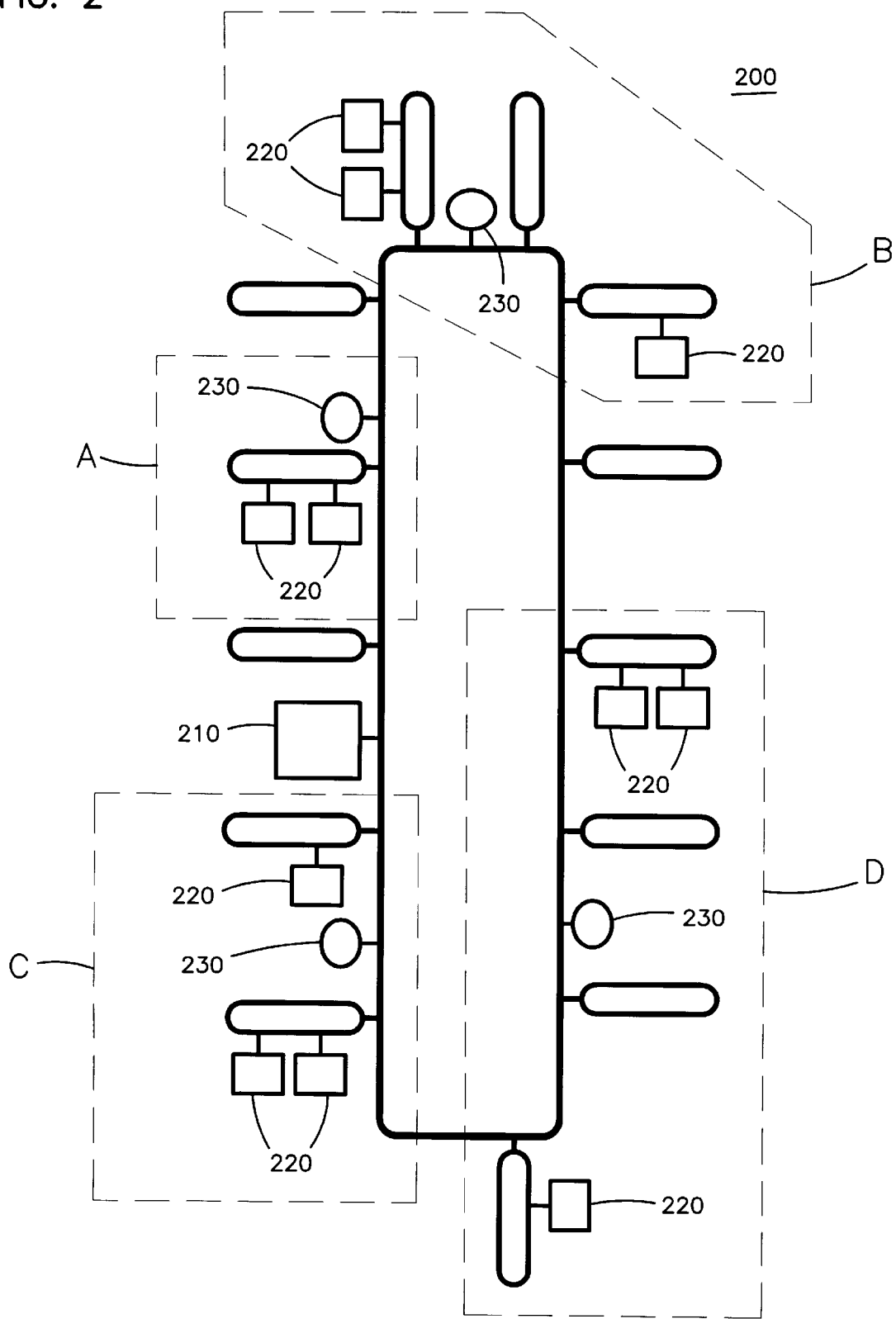
FIG. 2 illustrates an exemplary semiconductor fabrication facility in accordance with one embodiment of the invention.

FIG. 2 illustrates an exemplary fabrication facility having a reticle storage system as well as one or more reticle sorters in accordance with one embodiment of the invention. The exemplary fabrication facility 200 generally includes a reticle storage system 210, a plurality of photolithography exposure tools such as steppers 220, and one or more reticle sorters 230 each associated with a group of one or more of the photolithography steppers 220. The invention is however not limited to the use of photolithography steppers, but extends to cover any type of exposure tool which uses a reticle to transfer a pattern to a wafer. While not shown, it should be appreciated that each of the reticle storage system 210, reticle sorters 230, and photolithography steppers 220 are communicatively coupled to a host system (e.g., Workstream) and can operate under instructions from the host system.

The reticle storage system 210 typically provides the same functionality and may, if desired, be the same system as the conventional reticle storage system 130 discussed above. For example, the reticle storage system 210 may include a buffer for storing reticles and cassettes, inspection systems for inspecting various characteristics of the reticles, and a sorting system capable of rearranging the reticles within the cassettes as dictated by the host system.

The exemplary fabrication facility 200, as noted above, further includes one or more reticle sorters 230 each interfacing with a group of one or more photolithography steppers 220. The illustrated embodiment includes four reticle sorters 230 each of which handle the reticle sorting for an associated cell of photolithography steppers 220. Exemplary cell groupings A, B, C, and D are shown in FIG. 2. While only four reticle sorters 230 are illustrated in the exemplary embodiment, it should appreciated that as few as one and, more often, many more than four are used within a semiconductor fabrication facility. Typically, the number of reticle sorters in a fabrication facility is selected in consideration of the number of reticles used in the fabrication process as well as the number of photolithography steppers in the facility. For many applications, one reticle sorter for every 2 to 8 photolithography steppers would be suitable.

Figure 3A:
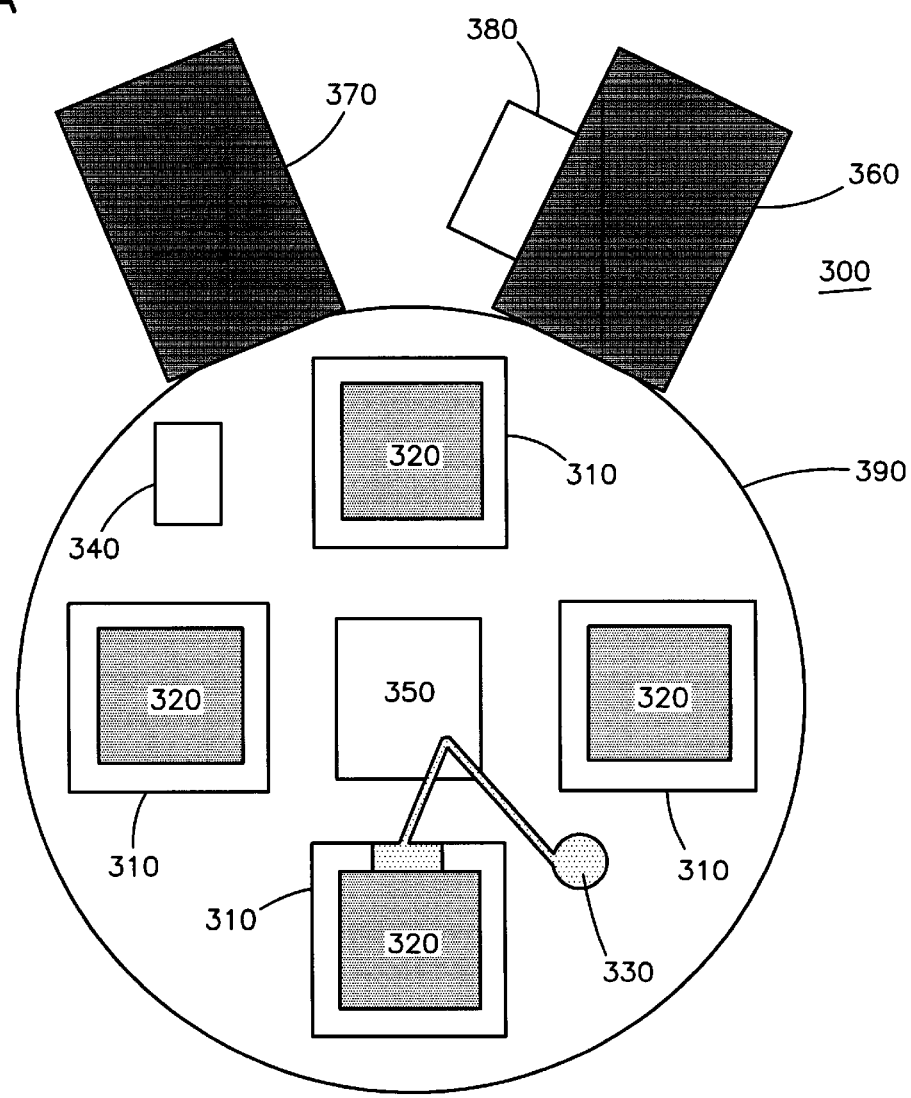
Figure 3B:
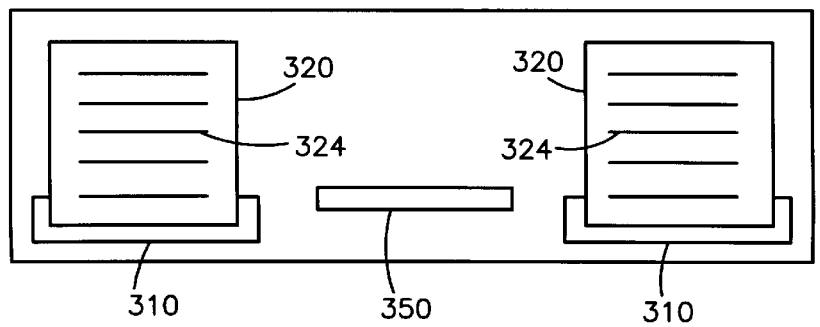

Reticle sorters generally provide efficient systems for sorting reticles within cassettes for associated cells of photolithography steppers 230. The invention is not limited to any particular physical arrangement of the reticle sorter, provided the reticle sorter is capable of holding one or more cassettes and accessing reticles within the cassettes for sorting the reticles into a desired order. By way of example and not of limitation, FIGS. 3A and 3B illustrate the physical features of an exemplary reticle sorter. The exemplary reticle sorter 300 generally includes one or more docking locations 310 each capable of holding a cassette 320 having slots for reticles 324 and an arm 330 capable of retrieving the reticles 324 from and inserting the reticles 324 into the slots in order to sort the reticles 324 within each cassette 320. Typically, the arm 330 operates under control of a controller 340 coupled to the arm 330 for controlling the sorting of the reticles 324 according to commands from a host system (not shown). The host system typically commands the arm 330 to sort the reticles within the cassettes in a manner which optimizes the use of the reticles when the cassettes 320 are dispersed to the cell of photolithography steppers with which the reticle sorter 300 is associated. The arm 330, similar to those used in conventional reticle storage systems, typically includes claws for grasping the plastic bevel edges of the reticles 324.

In the illustrated embodiment, the reticle sorter 300 further includes a reticle docking location 350, typically centrally located, on which a reticle 324 may be disposed. This provides a temporary holding place for a reticle 324 in the event reticles must be sorted and each cassette 320 within the reticle sorter 300 is full. In operation, the arm 330 accesses the reticles within a cassette, extracts a particular reticle and places the reticle in an open slot of a different or the same cassette. To open a desired slot within a cassette 320, the reticle 324 within the desired slot may be extracted and removed to another open slot or placed on the storage location 350.

The reticle sorter 300 typically further includes input and output ports 360 and 370, respectively, each of which are coupled to a cassette carrying path (not shown) for conveying the cassettes to and from the associated cell of photolithography stepper(s) as is well known in the art. Between the input port 360 and the docking area 390, one or more inspections systems 380 may be provided for inspecting characteristics of the reticles 324 as they enter the docking area 390 of the reticle sorter 300. The type and number of inspection systems employed can vary. For example, the reticle sorter 300 may include a video camera and display device for displaying an image of each reticle for visual inspection. Additional inspection systems, such as systems for dust particle monitoring and reticle pattern flaw detection, may be provided if desired. The video inspection system is simple and relatively inexpensive to provide. Inexpensive and/or frequently necessary inspections, such as a visual inspection, may advantageously be moved to the reticle sorters thereby preventing frequent trips to a reticle storage system. Less frequent and/or more expensive inspections, such as dust and pattern flaw detection, may remain at the reticle storage system. In this manner, reticle inspection (in addition to sorting) may be distributed throughout the semiconductor fabrication facility and wafer throughput may be increased.

Figure 4:
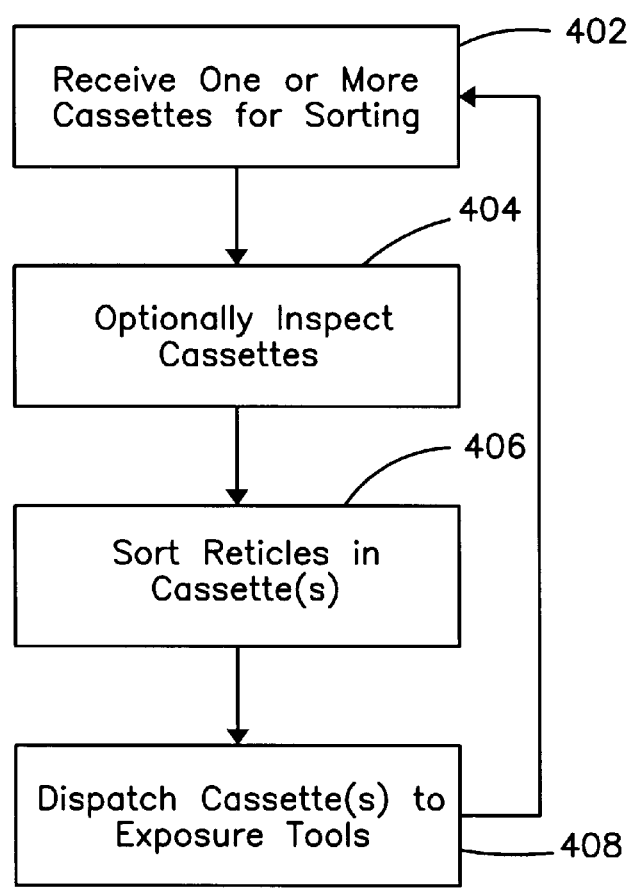
FIG. 4 illustrates a process flow for a reticle sorter in accordance with yet another embodiment of the invention.

FIG. 4 illustrates an exemplary flow process performed by a reticle sorter in accordance with one embodiment of the invention. As indicated at block 402, the reticle sorter first receives one or more cassettes for sorting. Typically, a host system, which tracks each of the reticle-storing cassettes, identifies a particular one or more cassettes for resorting and requests the cassettes to be moved to the reticle sorter. The selected cassettes may, for example, come from the reticle storage system and/or the cell of stepper(s) associated with the reticle sorter. This step may further include identifying the reticles within the cassettes in order to ensure that the proper reticles are being used. Typically, reticle identification is performed by reading a unique identifier of the cassettes and/or reticles using a scanner as is well known in the art. At this point, various characteristics of the reticles may optionally be inspected, as indicated at block 404. The inspection process may be performed serially with reticle identification in order to avoid multiple accessing of the reticle within the cassette.

Following inspection, if any, reticles within the cassette(s) are sorted, as indicated at block 406. Typically, this includes loading each cassette into a docking location using, for example, a robotic arm or an assembly track with the cassette being carried along the track and moved into a docking location which rotates to a pickup point. Once loaded, the reticles within the cassette(s) may be sorted. Typically, this includes, opening one or more cassettes, retrieving a particular reticle from an open cassette and placing the selected reticle in an open slot of the same or another cassette. If the desired slot for the selected reticle is not open, typically the desired slot is opened by removing the reticle from the desired slot and placing it in another open slot or on a reticle storage location. As noted above, the sorting of the reticle system is typically performed under control of a controller which receives instructions received from a host system.

The reticle sorter then dispatches the cassette(s) to the associated exposure tools (e.g., photolithography steppers), as indicated at block 408. Typically, this includes moving each cassette from its respective docking bay to the output port of the sorter using, for example, a moving means such as a robotic arm or a conveyor belt. Under control the host system, the cassettes are then dispatched to the appropriate photolithography stepper. After dispatching the cassettes, the reticle sorter then waits to receive another group of one or more cassettes for sorting, as indicated at block 402. In this manner, sorting of reticles is distributed throughout the fabrication facilities rather than isolated at the central storage unit. The need for reticle sorting by the reticle storage system is also reduced. The host system, however, typically periodically moves cassettes to the reticle storage system for storage and/or to undergo inspection beyond inspection applied at the reticle sorters.

By employing reticle sorters as discussed above, wafer throughput in a semiconductor fabrication facility can be increased. The reticle sorters can provide faster response to the associated cell of photolithography steppers and distribute the sorting and, in some instances, inspection functionality of a conventional reticle storage system throughout the fabrication facility. Throughput can further be enhanced by virtue of the physical layout of the reticle sorter within the fabrication facility. For example, reticle sorters may be placed closer to the associated cell than a central reticle storage system thereby reducing the path time of cassettes. The use of relatively inexpensive reticle sorters may also reduce fabrication facility costs by reducing the number of more expensive reticle storage systems needed in the facility.

As noted above, the present invention is applicable to a number of different fabrication plants which may benefit from the use of reticle sorters. The invention also applies to any reticle sorter having functionality as discussed above. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A semiconductor fabrication facility, including:
   a plurality of photolithography exposure tools;
   at least one reticle storage system including a buffer for storing cassettes; and
   one or more reticle sorters each associated with a group of one or more of the exposure tools, each reticle sorter including one or more docking locations each capable of holding a cassette having one or more reticles and sorting system for accessing and sorting reticles within each cassette;
   wherein the one or more reticle sorters each send and receive cassettes to and from the associated group of one or more exposure tools and the reticle storage system;
   wherein the reticle storage system buffer includes at least one hundred locations for holding cassettes.

2. The fabrication facility of claim 1, wherein the facility includes multiple reticle sorters at least one of which is associated with multiple exposure tools.

3. The fabrication facility of claim 1, wherein each reticle sorter is associated with two or more exposure tools.

4. The fabrication facility of claim 1, wherein at least one reticle sorter includes an inspection system for inspecting a reticle characteristic.

5. The fabrication facility of claim 4, wherein the inspection system includes a video camera coupled to a display device for presenting a visual image of a reticle.

6. The fabrication facility of claim 5, wherein the at least one reticle storage system includes a tool for measuring an amount of dust on a reticle and a tool for detecting flaws in a reticle pattern.

7. The semiconductor facility of claim 1, wherein the one or more reticle sorters includes a plurality of reticle sorters each communicatively coupled to the respective group of one or more exposure tools, wherein at least one of the reticle sorters is associated with multiple exposure tools.

8. A semiconductor fabrication facility, comprising:
   a plurality of exposure tools;
   at least one reticle storage system for storing and sorting cassettes, the storage system having one hundred or more locations for storing cassettes; and
   a plurality of reticle sorters each interfaced between the reticle storage system and an associated group of one or more of the exposure tools, each reticle sorter including one or more docking locations for holding cassettes containing one or more reticles and a sorting system for accessing and sorting reticles within the cassettes.

9. The semiconductor fabrication facility of claim 8, wherein the group of one or more exposure tools for each reticle sorter includes 2 or more exposure tools.

10. The semiconductor fabrication facility of claim 9, wherein the group of one or more exposure tools for each reticle sorter includes 2 to 8 exposure tools.

11. The semiconductor fabrication facility of claim 8, wherein each reticle sorter receives cassettes containing reticles from the associated group of one or more exposure tools and sorts the reticles within the cassettes.

12. The semiconductor fabrication facility of claim 11, wherein each reticle sorter further receives cassettes containing reticles from the reticle storage system and sorts the reticles within the cassettes from the reticle storage system and from the group of one or more exposure tools, and after sorting, dispatches one or more of the sorted cassettes to the associated group of one or more exposure tools.

13. The semiconductor fabrication facility of claim 12, wherein each reticle sorter sends cassettes containing reticles to the reticle storage system for one or more of sorting and inspection.

14. The semiconductor fabrication facility of claim 12, wherein the group of one or more exposure tools for each reticle sorter includes 2 or more exposure tools.

15. The semiconductor fabrication facility of claim 8, further including at least one more frequent inspection system provided on at least one of the reticle sorters and at least one less frequent inspection system provided on the reticle storage system and not on the reticle sorters.

16. The semiconductor fabrication facility of claim 15, wherein the more frequent inspection system includes a video inspection system and the less frequent inspection includes a flaw detection system.

17. A semiconductor fabrication facility, comprising:

a host system;

a plurality of exposure tools communicatively coupled to the host system;

at least one reticle storage system, communicatively coupled to the host system, having one hundred or more locations for storing cassettes and a first inspection system; and a plurality of reticle sorters communicatively coupled to the host system and coupled between the reticle storage system and an associated group of one or more of the exposure tools, each reticle sorter including:

a second inspection system different from the first inspection system;

one or more docking locations for holding cassettes containing one or more reticles; and a sorting system for accessing and sorting reticles within the cassettes;

wherein each reticle storage system receives cassettes containing reticles from the associated group of one or more exposure tools and from the reticle storage system, inspects the cassettes using the second inspection system and sorts the reticles within the cassettes, and after sorting, dispatches one or more of the sorted cassettes to the associated group of one or more exposure tools;

wherein the cassettes containing reticles are periodically moved to the reticle storage system for inspection by the first inspection system.

18. The semiconductor fabrication facility of claim 17, wherein the group of one or more exposure tools for each reticle sorter includes 2 or more exposure tools.

19. The semiconductor fabrication facility of claim 17, wherein the first inspection system is a flaw inspection system.

20. The semiconductor fabrication facility of claim 17, wherein reticle storage system further sorts reticles.

\* \* \* \* \*